(12) United States Patent
Malik et al.

(10) Patent No.: US 9,620,732 B2
(45) Date of Patent: Apr. 11, 2017

(54) METHOD OF FORMING A LIGHT-EMITTING DEVICE

(71) Applicant: Cambridge Display Technology, Ltd., Godmanchester (GB)

(72) Inventors: Surama Malik, Cambridge (GB); Colin Baker, Cambridge (GB); Laurence Scullion, Huntington (GB)

(73) Assignee: Cambridge Display Technology, Ltd., Godmanchester (GB)

( * ) Notice: Subject to any disclaimer, the term of this patent is extended or adjusted under 35 U.S.C. 154(b) by 0 days.

(21) Appl. No.: 14/993,355

(22) Filed: Jan. 12, 2016

(65) Prior Publication Data

US 2016/0211477 A1     Jul. 21, 2016

(51) Int. Cl.
*H01L 21/00*     (2006.01)
*H01L 51/52*     (2006.01)
(Continued)

(52) U.S. Cl.
CPC .... *H01L 51/5206* (2013.01); *H01L 21/02697* (2013.01); *H01L 51/0021* (2013.01);
(Continued)

(58) Field of Classification Search
CPC H01L 21/02697; H01L 51/5221; H01L 51/56
See application file for complete search history.

(56) References Cited

U.S. PATENT DOCUMENTS

2003/0108664 A1* 6/2003 Kodas ................ C09D 11/30
427/125

2006/0159838 A1* 7/2006 Kowalski ............... B82Y 30/00
427/58
(Continued)

FOREIGN PATENT DOCUMENTS

CN     102074570 A     5/2011
EP     1 536 473 A1     6/2005
(Continued)

OTHER PUBLICATIONS

Combined Search and Examination Report dated Jun. 25, 2015 for Great Britain Application No. GB1500748.7.

*Primary Examiner* — Douglas Menz
(74) *Attorney, Agent, or Firm* — Wolf, Greenfield & Sacks, P.C.

(57) ABSTRACT

A method of forming a light-emitting device comprises: forming patterned portions of precursor material over a substrate, the edges of the patterned portions defining sidewalls; performing a shaping control process on the patterned portions of precursor material to control the sidewall profile to reduce the angle the sidewalls of the precursor material make with the substrate to less than 15 degrees; selectively applying from solution a conductive coating onto the portions of shaped precursor material so as to form a plurality of first conducting contacts such that an upper surface of said conductive coating follows the sidewall profile of the precursor material; forming a light-emitting layer over the conductive contacts and substrate, and forming a plurality of second conducting contacts over the light-emitting layer. The precursor material may comprises an activator catalyst and the conductive coating comprises a metal selectively applied to the shaped precursor material by electroless plating.

12 Claims, 7 Drawing Sheets

(51) Int. Cl.
*H01L 51/56* (2006.01)
*H01L 51/00* (2006.01)
*H01L 51/50* (2006.01)
*H01L 21/02* (2006.01)

(52) U.S. Cl.
CPC ...... *H01L 51/5088* (2013.01); *H01L 51/5209* (2013.01); *H01L 51/5221* (2013.01); *H01L 51/56* (2013.01); *H01L 2251/301* (2013.01)

(56) References Cited

U.S. PATENT DOCUMENTS

| | | | |
|---|---|---|---|
| 2012/0204950 A1* | 8/2012 | Magdassi | C23C 4/18 |
| | | | 136/256 |
| 2013/0056244 A1* | 3/2013 | Srinivas | G06F 3/041 |
| | | | 174/250 |
| 2015/0090992 A1* | 4/2015 | Miyazawa | H01L 51/5271 |
| | | | 257/40 |
| 2015/0104936 A1* | 4/2015 | Markovich | H01L 31/02246 |
| | | | 438/610 |

FOREIGN PATENT DOCUMENTS

| | | |
|---|---|---|
| EP | 1 763 081 A2 | 3/2007 |
| JP | 2014-120353 A | 6/2014 |

* cited by examiner

Light emission

METHOD OF FORMING A LIGHT-EMITTING DEVICE

RELATED APPLICATIONS

This application claims the benefits under 35 U.S.C. §119(a)-(d) or 35 U.S.C. §365(b) of British application number GB 1500748.7, filed Jan. 16, 2015, the entirety of which is incorporated herein.

FIELD OF THE INVENTION

The present invention relates to a method of fabricating a light-emitting device such as an organic light-emitting diode (OLED), and to a display or lighting tile formed from such devices.

BACKGROUND

Techniques are known for forming opto-electronic devices such as light-emitting diodes (LEDs) over a substrate. Supported on the substrate, each such device comprises a layer of electroluminescent material disposed between two electrodes referred to as the anode and cathode. The device may also comprise a charge injection layer and/or a charge transport layer disposed between the electroluminescent layer and one (or both) of the electrodes. In modern devices, the electroluminescent layer, charge injection layer and/or charge transport layer may be formed of an organic polymer. An LED comprising one or more such organic layers may be referred to as an organic LED (OLED). In a particular application, an array of these devices may be formed over a substrate such as glass or transparent plastic in order to produce an electronic display screen for a computer, television, mobile terminal or other appliance.

Referring to FIG. 1, the method of forming a traditional OLED begins by providing a substrate 102 and then forming an anode 104 over the substrate 102.

The anode 104 is typically formed of a transparent metal-based material such as indium tin oxide (ITO) or other transparent conducting oxide (TCO). A hole injection layer 106 is then formed over the anode 104, a hole transport layer 108 is formed over the hole injection layer, an electroluminescent layer 110 is formed over the hole transport layer 108, and a cathode 112 is formed over the electroluminescent layer 110. Each of the hole injection layer 106, hole transport layer 108 and/or electroluminescent layer 110 may be formed of an organic polymer. Advantages of organic polymers along with some suitable solutions and deposition techniques are discussed in international patent application publication no. WO 2006/123167. One particular example of a hole-injecting material is PEDOT: PSS. That is, an active component of polyethylene-dioxythiophene ("PEDOT" or sometimes just "PEDT") doped with a matrix component of polystyrene sulfonate ("PSS"). The electroluminescent layer 110 itself may comprise an organic non-polymeric material, or a polymeric semiconductor, an example of which is poly(p-phenylenevinylene) ("PPV"). Suitable deposition techniques for these layers such as spin coating, dip coating and printing will be familiar to a person skilled in the art.

In operation, when a potential difference is applied between the anode 104 and cathode 112, holes ($h^+$) are injected into the device from the anode 104 and electrons ($e^-$) are injected from the cathode 112. The holes and electrons combine in the electroluminescent layer 110 to form an exciton which then decays to emit light (visible to the user through the transparent polymer layers 108, 106 and the transparent anode 104 and substrate 102). Injection of the holes from the anode 104 is assisted by the hole injection layer 106, and transport of the holes from the anode 104 to the electroluminescent layer 110 is assisted by the hole transport layer 108.

As shown in FIG. 2, more recently a type of OLED has been developed in which a high-conductivity organic polymer 106' is used to form the hole injection layer, allowing it to provide a function of both an anode and a hole injection layer.

That is to say, the hole injection layer 106' acts as both a donor of holes and a means to aid the injection of holes into the electroluminescent layer 110. This means no separate blanket anode layer 104 is required, and hence the hole injection layer 106' is formed directly over the substrate 102 without an intervening anode layer 104. This means no ITO or other transparent conducting oxides are required for the anode 104, which is advantageous because such materials are in limited supply and therefore costly, and can also be brittle. However, to reduce the sheet resistivity for large area devices, conducting metal tracks 103 (e.g. silver) are still required to be formed over the substrate 102 prior to or after deposition of the conducting polymer layer 106'. This metal anode tracking 103 makes electrical contact with the dual-purpose hole injection layer 106' so that electrical signals can be applied to operate the device.

Such an arrangement is disclosed for example in: [1] "Large Area ITO-free Flexible White OLEDs with Orgacon™ PEDOT:PSS and printed Metal Shunting Lines", Stephen Harkema et al, Hoist Centre, Organic Light Emitting Materials and Devices XIII edited by Frank So, Proc. of SPIE Vol. 7451 (2009), CCC code 0277-786X/09, doi: 10.1117/12.825246.

Another example is disclosed in: [2] "Highly efficient OLEDs on ITO-Free Polymeric Substances", Karsten Fehse et al, Institut für Angewandte Photophysik, Organic Optoelectronics and Photonics, edited by Paul L. Heremans et al, Proc. of SPIE Vol. 6192 (2006), CCC code 0277-786X/06, doi: 1117/12.662936. In this paper the function of anode, hole-injection layer and hole transport layer are all combined into a single organic conducting polymer layer.

It has been observed that the sharp edges to the anode metal tracking 103 in such devices is liable to cause thinning of subsequently deposited active layers, resulting in non-uniform light output and/or early failure of the device due to electrical shorts between the anode tracking 103 and the electroluminescent layer 110.

One solution which can mitigate this problem to some extent for small area devices is shown schematically in FIG. 3. Here, a bank or passivation structure (an insulating layer) 105 is formed over the anode metal tracking 103 and substrate 102. An example is the patterned resist passivation layer found on top of the tracking in an Orbeos lighting tile (OSRAM). However, this is impractical for large area devices (over about 15-20 cm across) where conductive tracking 103 is required throughout the entire active area to achieve the required conduction.

Another solution might be to use a thicker layer of the organic conducting polymer 106' to provide better coverage over the contact 103. However, this would have the disadvantage that it may compromise the optical properties of the device, resulting in a less efficient device because higher drive voltage conditions would be necessary to achieve comparable output to hole injection layer structures 106' having more optimal thinness.

The Holst Centre has reportedly overcome the thinning problem by covering the anode metal tracking 103 with an insulating planarization layer and then etching this layer back to reveal the anode metal tracking structure with infill planarization (see reference [1] above). This technique has its disadvantages by requiring very tight control of the etch back process to achieve planarization, and possible degradation of the anode metal tracking due to oxidation and physical damage.

It would therefore be desirable to find an alternative solution to the problem of thinning of the hole injection layer over a conducting contact in a light-emitting device such as an OLED.

SUMMARY OF THE INVENTION

The problem of thinning in a layer of a device is caused by the shape of underlying conducting contacts such as the anode metal tracking 103. Particularly, if any point in the side profile of the tracking 103 is more prominent than elsewhere over the profile then this point will have a higher electric field density, which is liable to cause hot spots during operation of the device. The hot spots can in turn cause deterioration of the material used in an adjacent layer such as a hole injection layer 106'.

For example, consider a comparative case shown schematically in FIG. 4 whereby a metal contact 103 is formed by photolithography having a profile with a sidewall angle of almost 90 degrees relative to plane of the substrate. In this example, a layer of precursor material 107 comprising negative photoresist is formed over the substrate 102, and a photomask 111 is placed over the precursor layer 107. Then the arrangement is then exposed to UV light which cures the precursor 107 in the regions exposed by the mask 111, causing cross-linking in the negative photoresist polymer and thus making it insoluble in the exposed regions. When a developer solvent is subsequently applied, only the cured precursor 107' remains whilst the uncured material is dissolved away, In the comparative example shown, this leaves portions of precursor material 107' having a substantially right-angled sidewall profile with respect to the substrate 102. These remaining portions of precursor material 107' are then coated with a metal 109 by a process such as electroless plating, resulting in metal tracking 103 having an upper surface with a substantially similar right-angled profile relative to the substrate 102.

However, thinning of the hole injection layer 106 caused by the sharp corners of this profile will induce high field density points, leading to hot spots and the potential for short circuits.

Hence, due to the topological effect of the anode metal tracking sidewall 103, there is the potential for thinning of the hole injection layer 106' over the tracking's edge, allowing a direct electrical connection between the anode tracking 103 and electroluminescent layer 110 causing a short and device failure. This is particularly the case for large area devices where anode metal tracking is necessary to achieve uniform luminescence across the entire area.

According to one aspect of the present invention, there is provided a method of forming a light-emitting device.

The shaping control process reduces the probability of thinning of the overlying intermediate layer and thus improves the uniformity of electric field density over the surface of the first conducting contacts during subsequent operation of the device. This advantageously reduces the likelihood of device failure due to electrical shorts between these contacts and the light-emitting layer. Having features with a shallow sloped profile enable much better step coverage when depositing subsequent layer from solution.

In embodiments, the precursor material comprises a light-curable material and an activator, and the formation of the portions of precursor material comprises selectively exposing said portions to light prior to the application of said conductive coating.

Preferably the light-curable material comprises one of a monomer based on an acrylate functional group, a monomer based on a methacrylate functional group, and a KTFR based resist.

The patterned portions of precursor material may formed by photolithography of a blanket deposited layer using a photomask, or by selective deposition such as printing, for example by ink jet printing or gravure or flexographic printing.

Another possible way of forming the patterned precursor is by direct writing using a scanned laser beam.

In one embodiment, the light-curable material preferably acts as a negative photoresist and the shaping control process comprises a proximity exposure, whereby a photomask used to selectively expose said portions of precursor material is held at a distance from the substrate during said photolithography. This is illustrated schematically in FIG. 6.

Advantageously, the precursor material comprises an activator in the form of a catalyst and the conductive coating comprises a metal selectively applied to the shaped precursor material by electroless plating.

In this case, one example of a shaping control process may comprise a reflow bake. A particular example is illustrated schematically in FIGS. 5 and 7.

In other embodiments the sidewall of the precursor material makes an angle with the planar substrate of less than or equal to five degrees. Preferably the portions of precursor material are each formed having a ratio of width to height being less than or equal to 0.007 in the plane of said sidewall profile.

The conducting coating comprises a metal, for example at least one of copper, nickel, gold, silver and Ni:P (nickel:phosphorus). Preferably, the light-emitting layer comprises an electroluminescent organic polymer or organic non-polymeric material. The light emitting layer may also comprise a phosphorescent guest in an organic matrix. Many organic electroluminescent materials are known. A summary of known materials is provided in Chapters 2, 3 and 4 of the book "Organic Light-Emitting Materials and Devices" edited by Zhigang Li and Hong Meng and published by Taylor and Francis in 2007 (ISBN 1-57444-574-X).

According to another aspect of the present invention, there is provided a light emitting device as specified in claims 14 to 21.

BRIEF DESCRIPTION OF THE DRAWINGS

For a better understanding of the present invention and to show how it may be put into effect, reference is made by way of example to the accompanying drawings in which.

DETAILED DESCRIPTION OF PREFERRED EMBODIMENTS

In one aspect of the present invention, the topological profile of the anode metal tracking 103' is controlled to give a sloped profile resulting in better step coverage of subsequent layers such as hole injection layers, hole transport layers and light emitting layers. This enables manufacture of a final device with less potential for failure due to shorts between the anode and the electroluminescent and cathode layers.

Figure 1:
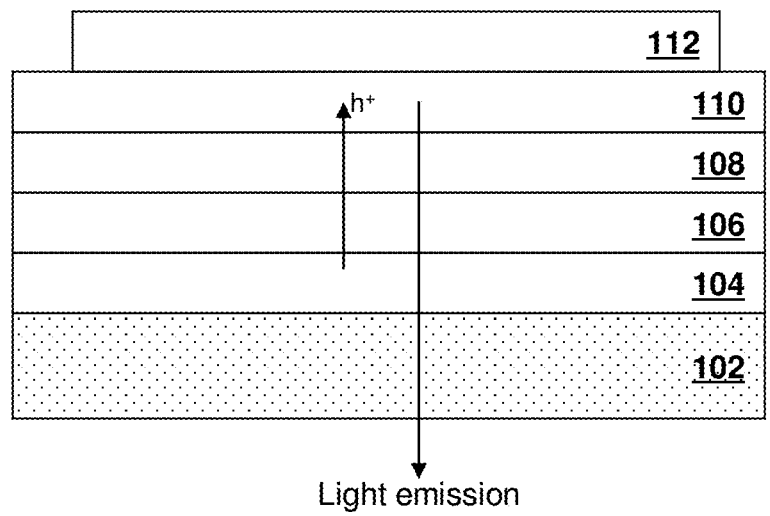
FIG. 1 is a schematic side cross section through the layers of an OLED.
Figure 2:
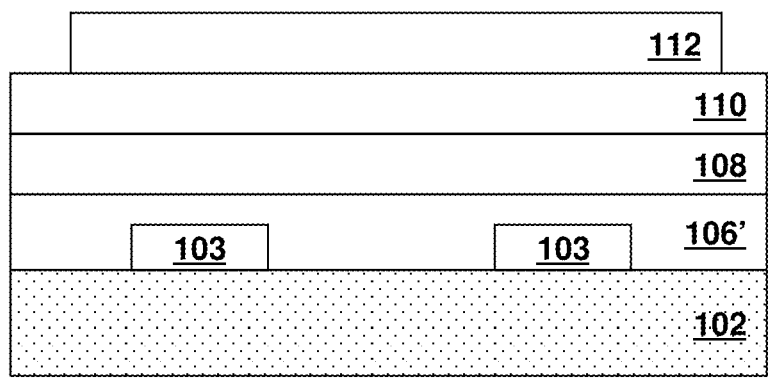
FIG. 2 is a schematic side cross section through the layers of another OLED.
Figure 3:
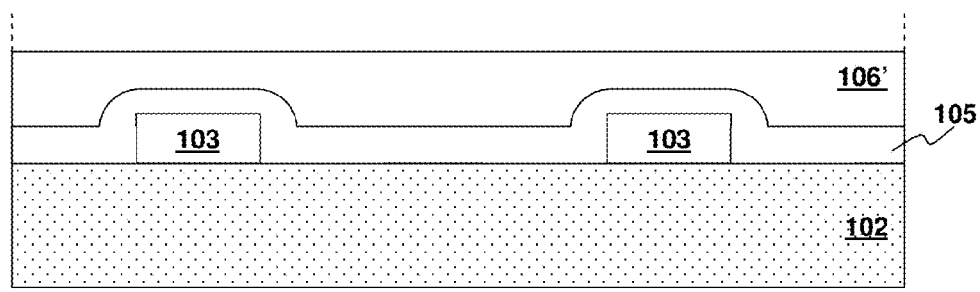
FIG. 3 schematically illustrates a passivation layer formed in an OLED.
Figure 4:
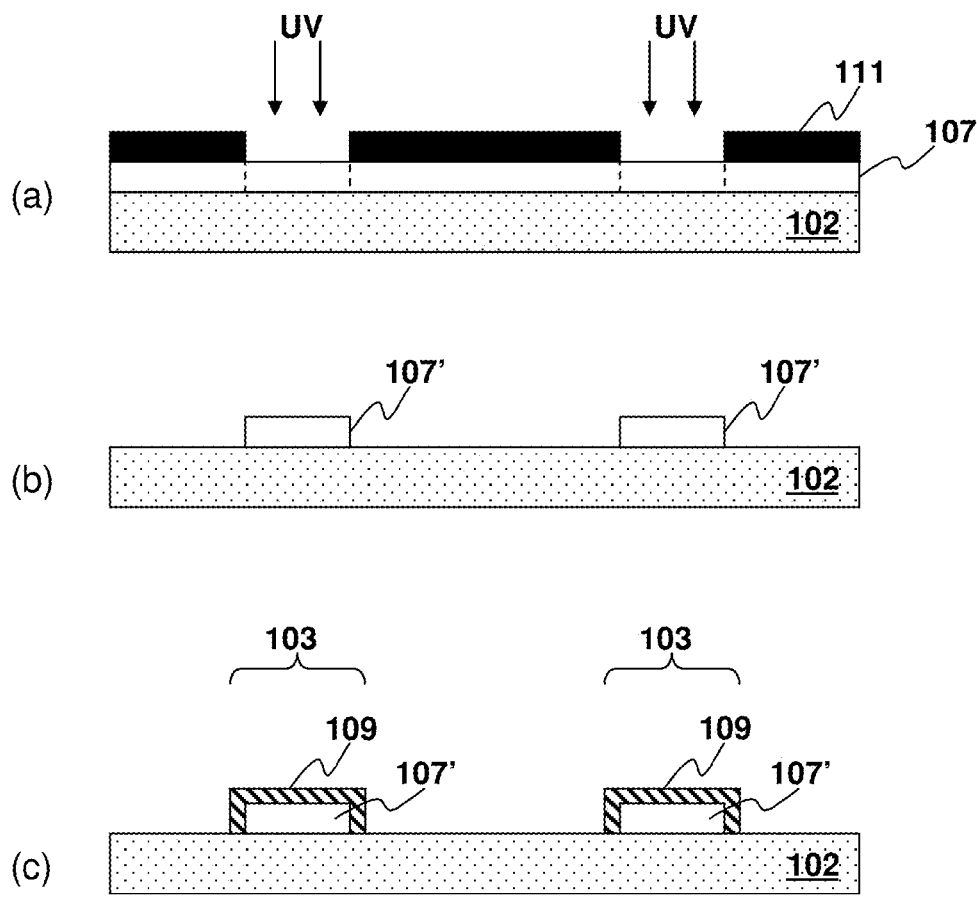
FIG. 4 schematically illustrates a method of forming metal track for an OLED.

As discussed in relation to FIG. 4, without such control then the fabrication process may result in an OLED device with anode metal features 103 having a profile with close to 90 degree sidewalls. To achieve the optimum device performance a hole injection layer 106' of specific thickness will subsequently be deposited. Due to the topological effect of the anode metal tracking sidewall then there is the potential for a) a reduction in external quantum efficiency and non-uniform light output due to a bright edge next to the metal track, and/or b) thinning of the hole injection layer 106' over the tracking's edge, allowing the development of a direct electrical connection between the anode tracking 103 and electroluminescent layer 110, causing a short and device failure. This is particularly the case for large area devices where anode metal tracking 103 is required to achieve uniform luminescence across the entire area by the inclusion of a fine metal/conducting grid in the active area.

In the described method the sidewall of anode metal tracking 103' is controlled by patterning the metal such that the sidewalls are purposely sloped, allowing improved coverage and uniform coverage with hole injection layer 106' or subsequent OLED layers (e.g. conductive polymer, hole injection layer, PEDOT:PSS, insulating layers, light emitting layers or cathode stack).

The process for patterning lighting panel tracking 103' is modified to produce shallow angle sidewalls to prevent sharp edges which would induce high field density points and local thinning of device layers. Hence, the occurrence of electrical shorts can be reduced without the need for additional planarisation or passivation layers. The process will also improve the uniformity of light output and increase efficiency. The method is designed to reduce process complexity, enable higher yields and more uniform emission characteristics.

Figure 5:
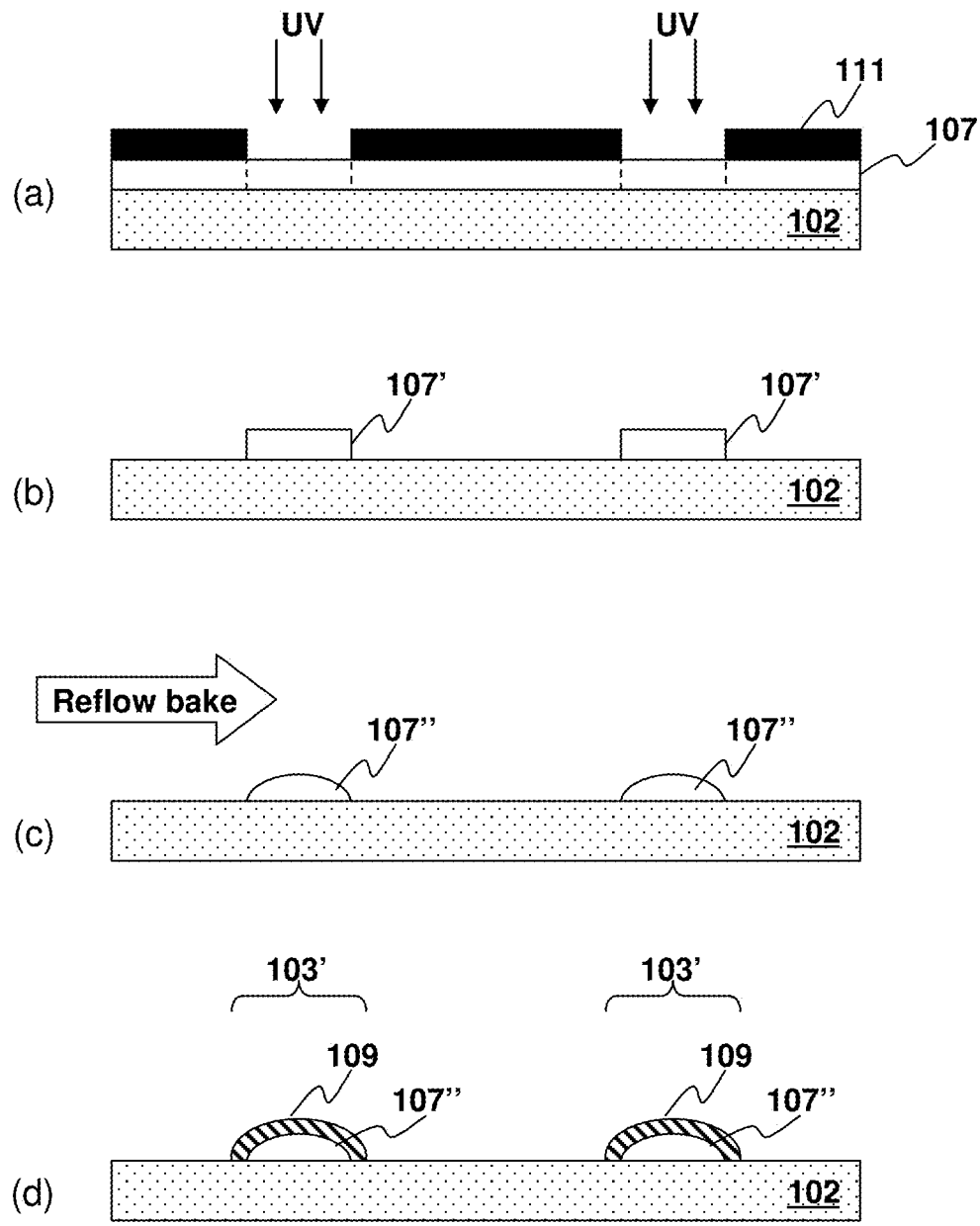
FIG. 5 schematically illustrates another method of forming metal tracks.

By way of example, a first embodiment of the present invention is now described in relation to FIG. 5.

The method begins at step 5(a) by providing a substrate 102, preferably of a transparent material such as glass or a suitable plastic such as PEN. Next, a layer of UV curable precursor material 107 comprising negative photoresist and a catalyst is deposited over the substrate 102, and a photomask 111 is placed over the precursor layer 107. The arrangement is then exposed to ultraviolet (UV) light from above. The negative photoresist in the precursor 107 contains UV cross-linkable polymers that are cured (hardened) when exposed to UV light based on a free radical photopolymerisation reaction. Examples of suitable monomers are based on acrylate and methacrylate functional groups or e.g. KTFR based resists. Suitable liquids comprising a curable composition and an activator such as a catalyst as described in U.S. Pat. No. 8,435,603 and are commercially available from Conductive Inkjet Technologies Limited in the UK.

When exposed to UV light, only those regions of the precursor layer 107 not shielded by the photomask 111 will be cured, making them insoluble in the developer solvent, whereas the unexposed regions that were blocked by the photomask 111 remain soluble.

So when the developer solvent is applied to the precursor layer 107 at step 5(b), then only the cured portions 107' will remain whilst the uncured portions are dissolved away. This results in patterned portions 107' of the precursor, which will then be selectively coated with a conducting material 109 in order to form the anode tracking 103'.

However, the side profile of the precursor portions 107' immediately resulting from this photolithography process (i.e. the profile in a plane perpendicular to the substrate 102) will have close to a 90-degree sidewall with sharp corners. As a result the conducting coating 109 will also have sharp corners. As discussed, these corners will generate high, non-uniform field density points during operation of the finished device, causing heat spots and hence thinning of the overlying hole injection layer 106'.

To address this problem, unlike FIG. 4, a shaping control process is applied at step 5(c). In this example the shaping control process takes the form of a "reflow bake", sometimes also referred to as a "post exposure bake" (PEB). This is the process of heating the remaining precursor 107' after the exposure, e.g. on a hotplate or in an oven. The cured precursor 107' will usually contain some solvent remaining from the photolithography process, even after the photolithography step is completed. The reflow bake step works by driving out this residual solvent, which at the same time also causes a degree of rearrangement of the precursor material, softening its side profile. Thus the shape of the patterned precursor may be altered from a first, sharp profile 107' to a second, smoother profile having curved or sloped sidewalls relative to the substrate 102.

The temperature range and timing for the bake will depend on the particular precursor used, but typically will be performed at temperature between 50 to 100 degrees Celsius for less than or equal to 10 minutes. Typically the bake will be at a temperature higher than the glass transition temperature of the precursor.

Once the shaping control process has been performed, at step 5(d) an electroless plating process is performed in order to coat the patterned precursor material 107 with a suitable metal 109. To achieve this the precursor material 107 will also contain an activator—in the present case a catalyst such as palladium acetate, which attracts metal from a metal ion solution applied in the electroless plating process. A suitable technique for forming fine conducting anode metal grids via an electroless plating process using patterned photoresist as the precursor is described in international patent application publication no. WO 2004/068389 and U.S. Pat. No. 8,435,603.

The patterned, shaped precursor material 107" is thus immersed into an electroless solution to produce a patterned metal structure, e.g. of silver, copper, nickel Ni:P and/or gold (e.g. Cu, CuNi, CuNiAu) which is deposited only on top of the precursor material 107'''. The upper surface of the resulting metal coating 109 will follow the profile of the precursor material 107" over which it is formed, at least to an extent (i.e. the underside of the plating is shaped and the upper surface will to some degree follow that shape).

A patterned precursor 107' which exhibits steep sidewalls will result in a plated surface 109 which may be difficult to planarise or coat with a hole injection layer 106' or following OLED device layers as described earlier. However a patterned precursor 107" with shallow sidewalls will result in a metal profile 109 that is also shallow in profile and therefore allow improved coverage and uniform coating with hole injection layer or subsequent OLED layers. As a result, the smoother profile of the shaped precursor 107" and its metal coating 109 will provide a more uniform field density over the surface of the resulting anode tracking 103 during subsequent operation of the finished device, reducing the presence of heat spots and therefore reducing thinning of the overlying hole injection layer 106'.

The hole injection layer 106' may be formed over the substrate 102 and anode tracking 103' by known techniques, e.g. solution processing of an organic conducting polymer. For example, the solute may be a hole-injecting material comprising an "active" component doped with a typically larger amount of host "matrix" component. The active component is that actually chosen for its ability to promote hole injection, whilst the matrix component is a charge balancing counterion. One particular example of a hole-injecting material disclosed in WO 2006/123167 is PEDOT:PSS. That is, an active component of polyethylene-dioxythiophene ("PEDOT" or sometimes just "PEDT") doped with a matrix component of polystyrene sulfonate ("PSS").

Other solution processable hole injection materials which can be used in place of PEDOT:PSS to form hole injection layers are commercially available from Plextronics (now Solvay) and Hereaus. Suitable materials are also described, for example, in U.S. Pat. No. 7,358,660 and WO 2010/095618. A blanket layer of ITO may also be used together with a less conducting hole injection layer, such as those available from Nissan Chemical Co. This less conducting hole injection layer can be deposited either under the metal tracking or over the metal tracking.

Once the hole injection layer 106 has been deposited and dried, a hole transport layer 108 is optionally formed over the hole injection layer in order to facilitate transport of holes from the anode 104 to the electroluminescent layer 110. By way of example, the hole transport layer 108 may comprise an organic polymeric material such as PEDOT:PSS, and may also be formed by any suitable solution-processing technique such as ink jet printing. Next the electroluminescent layer 110 itself is formed over the hole transport layer 108. By way of example, this may comprise an organic polymeric semiconductor such as poly(p-phenylenevinylene) ("PPV"), polyfluorene, or PVK, or a semi-conducting polymer host and phosphorescent guest, and again may be formed using any suitable solution-processing technique such as ink jet printing, gravure or flexographic printing, spin coating, slot-die coating, etc. The hole transport layer improves operation of the device by helping to match energy levels of the anode 104 and electroluminescent layer 110. Suitable examples of hole transport materials include triaryl amines, triphenylmethanes, phenylazomethines, and co-polymers of these repeat units with other repeat units such as polyfluorenes. Such materials are described, for example, in the book "Organic Light-Emitting Materials and Devices" Edited by Zhigang Li and Hong Meng (Taylor and Francis, [2007]).

The cathode 112 is then formed over the electroluminescent layer 110, e.g. by vapour deposition. The cathode may comprise for example a low work function metal such as calcium, barium or magnesium with a capping layer of aluminium and optionally including an additional layer immediately adjacent the electroluminescent layer such as lithium fluoride or sodium fluoride for improved energy level matching.

Additionally, various stages of forming associated drive circuitry will be included. These are excluded from the Figures for clarity, but will be familiar to a person skilled in the art.

Figure 6:
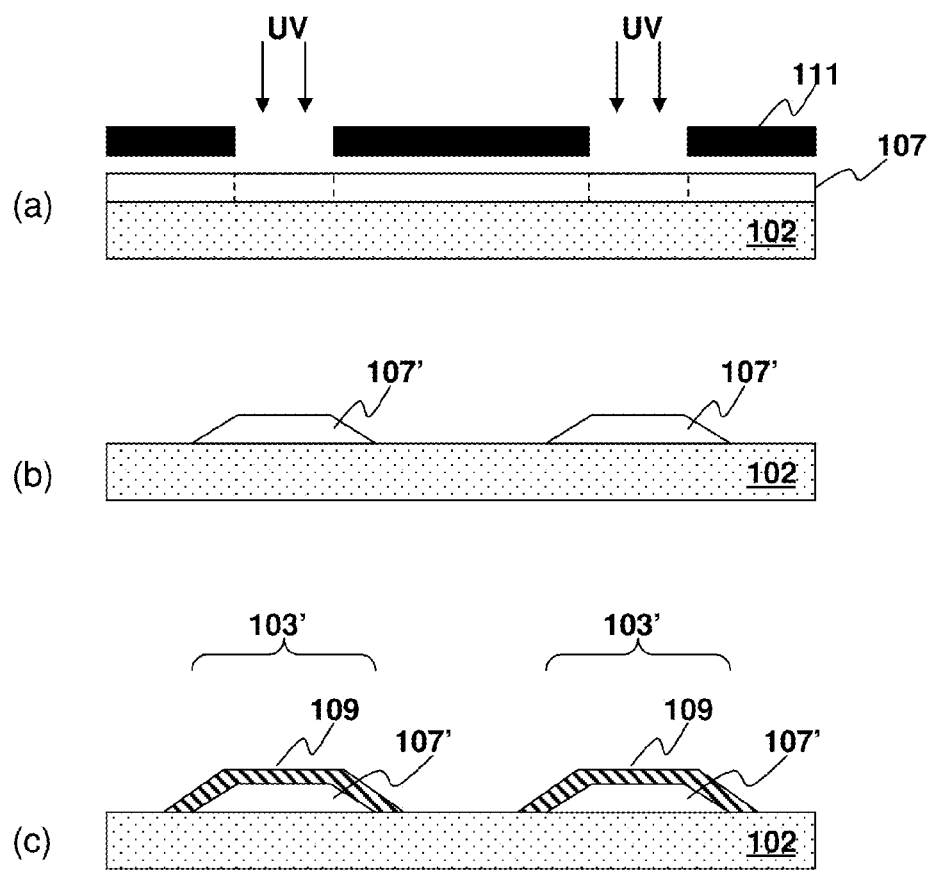
FIG. 6 schematically illustrates another method of forming metal tracks.

A second embodiment of the invention is now described in relation to FIG. 6.

The method begins similarly to that of FIG. 5, by providing a substrate 102, preferably of a transparent material such as glass or a suitable plastic, depositing a layer of precursor material 107 comprising negative photoresist and an activator material as previously described over the substrate 102, and placing a photomask 111 above the precursor layer 107. The arrangement is then exposed to ultraviolet (UV) light from above.

However, in the second embodiment the shaping control process is performed at step 6(a) as constituent part of the photolithography process, by holding the photomask 111 at a small distance away from the precursor layer 107 during the exposure, leaving a separation therebetween in which air (or other oxygen atmosphere) exists. This may be referred to as a "proximity exposure".

The described photolithography process uses a negative photoresist that contains ultra violet (UV) cross linkable polymers that are based on a free radical photopolymerisation reaction and exposing in proximity. Such polymerisation reactions are sensitive to oxygen content. Examples of suitable monomers are based on acrylate and methacrylate functional groups or e.g. KTFR based resists.

Alternative negative photoresist materials suitable for use in this invention include SU-8 type materials, negative photoresists available from Sumitomo Chemical Company, and PMMA (polymethylmethacrylate).

Owing to the presence of oxygen at the resist/air interface when exposing in proximity mode, cross linking cannot occur as the oxygen reacts or scavenges rapidly for the free radical group needed in the photopolymerisation reaction. This results in the uppermost surface of the resist 107 being still soluble even after exposure. The resulting profile after exposure and development of the resist at step 6(b) is thus sloped and shallow relative to the substrate 102, and therefore advantageous for producing metal sidewalls 109 of shallow angle when the electroless plating process is applied at step 6(c).

Figure 8:
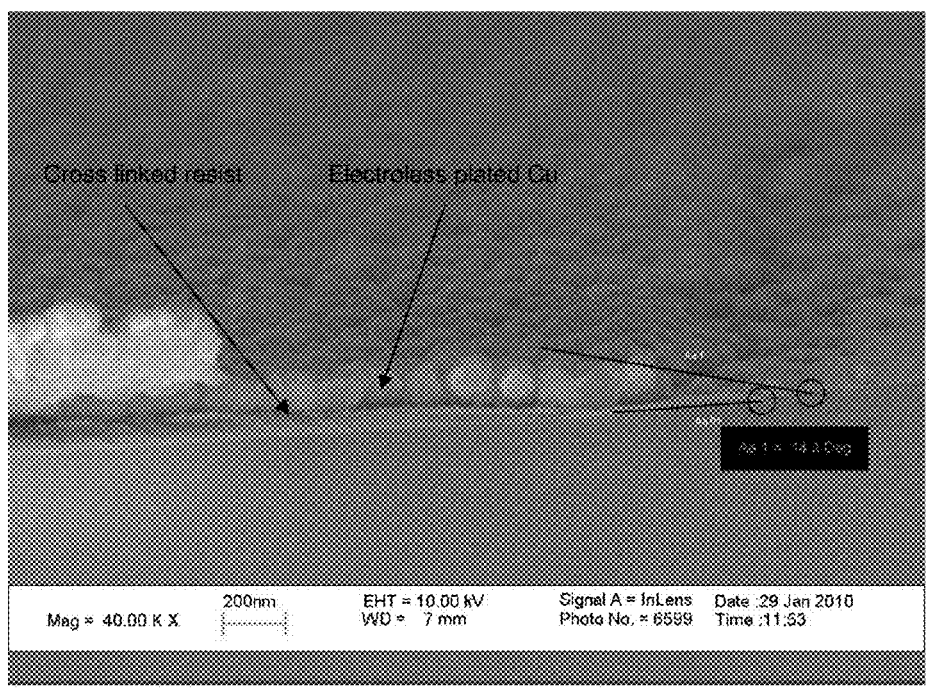
FIG. 8 is an SEM image of a metal track profile.

An example of such a profile measured by SEM is shown in FIG. 8. Here a sidewall profile of resist 107' and Cu metal metal plating 109 is achieved with an angle of 10 degrss at the edge.

The slope of the sidewall of the precursor material with respect to the substrate surface after shaping is preferrably less than 14 degrees. Preferably less than 5 degrees. Very preferably 1 or 2 degrees. The shallower the slope the better from a step coverage point of view. Very shallow slopes will provide large areas with very thin material which can lead to reduced light emission, so the shallowness of the slope can be a compromise.

A third embodiment of the present invention combines the techniques of both the first and second embodiment, by using a proximity exposure as shown in steps (a) and (b) of FIG. 6 followed by a reflow bake as shown in step (c) of FIG. 5 to further smoothen the sidewall profile. In this case the reflow bake step may be an "insufficient" bake.

Figure 7:
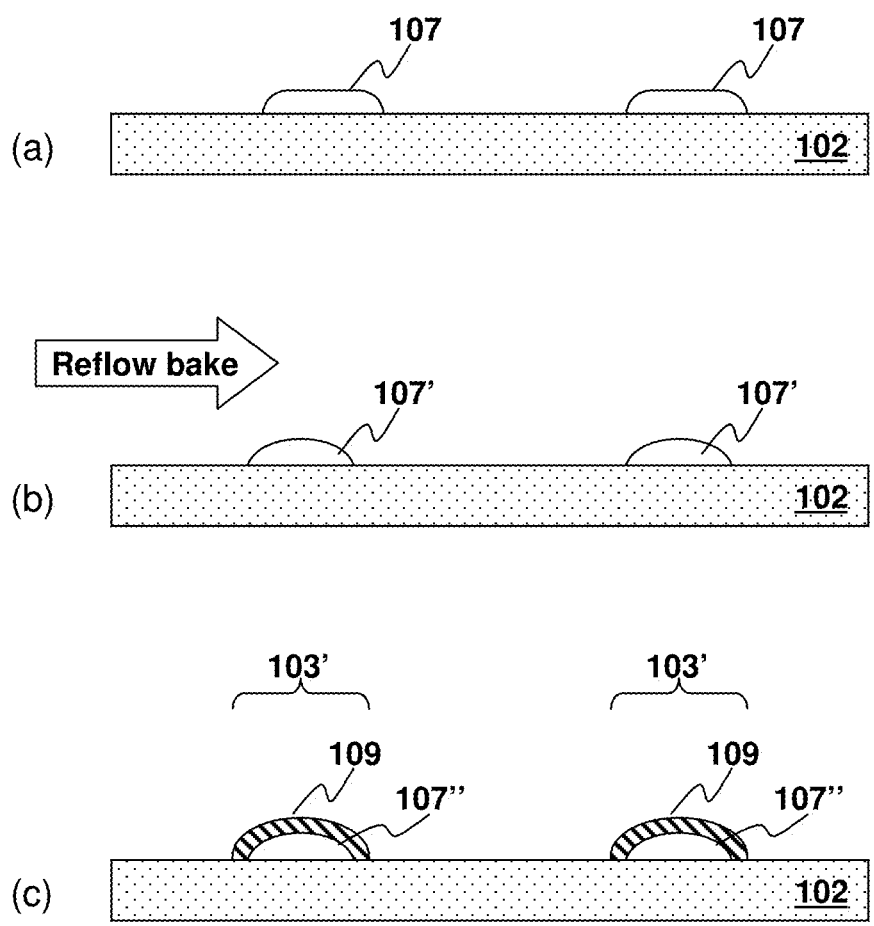
FIG. 7 schematically illustrates another method of forming metal tracks.

In a fourth embodiment, the sidewall profile of the tracking 103' is formed by a conductive ink or precursor 107' deposited via an ink-jet printing process. In this case, the sidewall process may be controlled by flood exposure, a reflow bake process, or by ink formulation design (e.g.

control of surface energy or tension of the ink, or control of contact angle). See for example FIG. 7.

As a further alternative, a sloping sidewall of the precursor resist material may be formed by maskless grayscale lithography, as described in Rammohan, Dwivedi, Martinez-Duarte, Katepalli, Madou and Sharma, Sensors and Acuators, B153 (2011) pp 125-134 (which is incorporated herewith in its entirety) or Rogers et al. Optics Express, Vol. 12, No. 7, pp 1294-1303 (5 Apr. 2004). This technique employs scanning of a light beam rather than exposure through a mask to form a pattern in the resist.

The techniques used above may result in a resist profile 107' or 107" having a ratio of width-to-height of less than or equal to 0.007. E.g. an exemplary resist profile will be approximately 10 microns across by 65-70 nanometers high. These dimensions provide particularly improved performance, though other dimensions may still show beneficial improvements. The sidewall profile is again preferably sloped at an angle of 5 degrees or less with respect to the substrate 102.

It will be appreciated that the above embodiments have been described only by way of example.

For instance, the invention is not limited to the particular shaping control processes described above. Nonetheless, note that by shaping control process is meant some purposeful shaping involving taking positive action to produce the desired shape, e.g. by adjusting the proximity of the mask in a photolithography process, or by a reflow bake, or by deliberately controlling one or more factors of an inkjet printing process such as controlling the ink's surface tension; rather that just an incidental shaping that might happen to arise.

Further, the invention is not limited by the specific device layering described above. More generally, the principle of the invention may apply in any situation where the profile of a coated conducting contact may have a deleterious effect on an overlying intermediate layer such as a charge-injection layer and/or charge transport layer formed between the contact and a light-emitting layer. E.g. one alternative arrangement would comprise cathode tracking formed over the substrate and the anode as the top electrode, and comprising an electron injection layer and/or electron transport layer between the cathode and an electroluminescent layer.

Furthermore, note that the precursor is not limited to the examples described above. E.g. the precursor could be any composition comprising a catalyst or activator for electroless plating and a further curable or hardening substance to provide the pattern. In the case of a light-curable precursor, note that this does not limit to any particular frequency of light such as visible or UV, but could more generally mean any electromagnetic radiation. On a point of terminology, note also that in the context of photolithography then a light-curable material may be referred to equally as a negative photoresist, but in other contexts such as ink jet printing it may simply be called a light-curable material.

Although polymer layers deposited by solution processing techniques such as gravure or flexographic printing, ink jet printing, spin coating or slot die coating have been described, organic layers may as an alternative be prepared from solutions comprising non-polymeric (also known as "small molecule" materials). Such materials are described, for example, in Chapter 3 of the book "Organic Light-Emitting Materials and Devices" Edited by Zhigang Li and Hong Meng (Taylor and Francis, [2007]).

In summary, a method of forming a light-emitting device, comprises: forming patterned portions of precursor material over a substrate, the edges of the patterned portions of precursor material defining sidewalls; performing a shaping control process on the patterned portions of precursor material to control the sidewall profile of the precursor material to reduce the angle the sidewalls of the precursor material make with the substrate to less than 15 degrees; selectively applying from solution a conductive coating onto the portions of shaped precursor material so as to form a plurality of first conducting contacts such that an upper surface of said conductive coating follows the sidewall profile of the precursor material; forming a light-emitting layer over the conductive contacts and substrate, and forming a plurality of second conducting contacts over the light-emitting layer. The precursor material may comprises an activator catalyst and the conductive coating comprises a metal selectively applied to the shaped precursor material by electroless plating.

Other configurations or applications of the present invention may be obvious to a person skilled in the art given the disclosure herein. The present invention is not limited by the described embodiments but only by the appendant claims.

The invention claimed is:

1. A method of forming a light-emitting device, the method comprising:
   providing a planar substrate;
   forming patterned portions of precursor material over the substrate, the edges of the patterned portions of precursor material defining sidewalls;
   performing a shaping control process on the patterned portions of precursor material to control the sidewall profile of the precursor material to reduce the angle the sidewalls of the precursor material make with the planar substrate to less than 15 degrees;
   selectively applying from solution a conductive coating onto the portions of shaped precursor material so as to form a plurality of first conducting contacts such that an upper surface of said conductive coating follows the sidewall profile of the precursor material;
   forming a light-emitting layer over the conductive contacts and substrate, and
   forming a plurality of second conducting contacts over the light-emitting layer.

2. A method as claimed in claim 1, wherein the precursor material comprises a light-curable material and an activator, and the formation of the portions of precursor material comprises exposing said portions to light prior to the application of said conductive coating.

3. A method as claimed in claim 2, wherein the light-curable material comprises one of a monomer based on an acrylate functional group and a monomer based on a methacrylate functional group.

4. A method as claimed in claim 1, wherein the patterned portions of precursor material are formed by photolithography.

5. A method as claimed in claim 1, wherein the patterned portions of precursor material are formed by printing.

6. A method as claimed in claim 2, wherein the light-curable material acts as a negative photoresist and the shaping control process comprises a proximity exposure, whereby a photomask used to selectively expose said portions of precursor material is held at a distance from the substrate during said photolithography.

7. A method as claimed in claim 1, wherein the precursor material comprises an activator catalyst and the conductive coating comprises a metal selectively applied to the shaped precursor material by electroless plating.

8. A method as claimed in claim 1 wherein the shaping control process comprises a reflow bake.

9. A method as claimed in claim 1, wherein the sidewall of the precursor material makes an angle with the planar substrate of less than or equal to five degrees.

10. A method as claimed in claim 1, wherein the portions of precursor material are each formed having a ratio of width to height being less than or equal to 0.007 in the plane of said sidewall profile.

11. A method as claimed in claim 1, wherein the conducting coating comprises at least one of silver, copper, nickel, gold and Ni:P.

12. A method as claimed in claim 1, wherein the light-emitting layer comprises an electroluminescent organic material.

\* \* \* \* \*

UNITED STATES PATENT AND TRADEMARK OFFICE
CERTIFICATE OF CORRECTION

| | | Page 1 of 1 |
|---|---|---|
| PATENT NO. | : 9,620,732 B2 | |
| APPLICATION NO. | : 14/993355 | |
| DATED | : April 11, 2017 | |
| INVENTOR(S) | : Surama Malik et al. | |

It is certified that error appears in the above-identified patent and that said Letters Patent is hereby corrected as shown below:

On the Title Page

After (65) Prior Publication Data

US 2016/0211477 A1 July 21, 2016

Please add item:

(30) Foreign Application Priority Data

January 16, 2015 (GB).................1500748.7

Signed and Sealed this
Sixth Day of June, 2017

Michelle K. Lee
*Director of the United States Patent and Trademark Office*